US007299166B1

(12) United States Patent
Liu et al.

(10) Patent No.: US 7,299,166 B1
(45) Date of Patent: Nov. 20, 2007

(54) SYSTEM AND METHOD FOR CHARACTERIZING AND SIMULATING A FREQUENCY TRANSLATION DEVICE

(75) Inventors: Jiang Liu, Tampa, FL (US); Terje Borge Svensen, Miami, FL (US); Lawrence P Dunleavy, Land O'Lakes, FL (US)

(73) Assignee: University of South Florida, Tampa, FL (US)

( * ) Notice: Subject to any disclaimer, the term of this patent is extended or adjusted under 35 U.S.C. 154(b) by 684 days.

(21) Appl. No.: 10/605,628

(22) Filed: Oct. 15, 2003

Related U.S. Application Data

(60) Provisional application No. 60/319,618, filed on Oct. 15, 2002.

(51) Int. Cl.
*G06F 17/50* (2006.01)
*G06G 7/62* (2006.01)

(52) U.S. Cl. .................. 703/13; 702/75; 324/76.23

(58) Field of Classification Search ............... 703/13
See application file for complete search history.

(56) References Cited

U.S. PATENT DOCUMENTS

| | | | | |
|---|---|---|---|---|
| 3,663,954 | A * | 5/1972 | Alker .......................... | 324/620 |
| 4,028,622 | A * | 6/1977 | Evans et al. ................ | 324/624 |
| 5,089,782 | A * | 2/1992 | Pike et al. .................. | 324/623 |
| 5,867,416 | A * | 2/1999 | Feldmann et al. .......... | 708/801 |
| 7,016,823 | B2 * | 3/2006 | Yang ............................ | 703/2 |

OTHER PUBLICATIONS

Dunleavy et al, "Mixer Measurements using Network and Spectrum Analysis", 48th Automatic RF Techniques Group Conference, Dec. 1996.*
Dunleavy et al, "Characterization and Simulation of a 915MHz Wireless Receiver", 50th Automatic RF Techniques Group Conference, Dec. 1997.*
Narhi, "Frequency-Domain Analysis of Strongly Nonlinear Circuits Using a Consistent Large-Signal Model", IEEE Transactions on Microwave Theory and Techniques, vol. 44, No. 2, Feb. 1996.*
Pratap, "Getting Started with MATLAB, A Quick Introduction for Scientists and Engineers", Saunders College Publishing, pp. 3-5, 1996.*
Lassesen, "Simulation and Measurement of Wireless Transmitter and Receiver Hardware", Master's Project Report, University of South Florida, sections 2.1.3, 2.1.4, 2.1.7, 3.6, 3.7, 4.1.6, 4.3, A.6, Appendix E, Aug. 2000.*
Benabe et al, "Simulation of a 915 MHz receiver Using the HP Advanced Design System", ARFTG Conference Digest, Computer-Aided Design and Test for High-Speed Electronics, pp. 28-38, 1998.*

(Continued)

*Primary Examiner*—Zoila Cabrera
*Assistant Examiner*—Mary C. Jacob
(74) *Attorney, Agent, or Firm*—Molly L. Sauter; Smith & Hopen, P.A.

(57) ABSTRACT

The present invention is a system and method of characterizing and simulating frequency translation devices. By supplying a stimulus condition as input to the frequency translation device, measurements of the intermodulation products in the output spectrum can be obtained. The measurements include both sum intermodulation products and difference intermodulation products. An index file is established to enable the extraction of the intermodulation products dependent upon a requested simulation response.

35 Claims, 19 Drawing Sheets

OTHER PUBLICATIONS

Van Moer et al.; Proving the Usefulness of a 3-Port Nonlinear Vectorial Network Analyser Through Mixer Measurements; IEEE MTT-S Digest; 2003.

Terrovitis; Noise and Distortion Analysis of Active CMOS Mixers; Qualifying Examination Proposal, May 1999.

Faria et al.; The Use of Intermodulation Tables for Mixer Simulations; Microwave Journal; Apr. 2002.

Liu et al.; A Table-Based Asymmetric System Mixer Model; Department of Electrical Engineering; University of South Florida, 2003.

Liu et al.; Automated Measurement of Intermodulation Tables for Mixers; Center for Wireless and Microwave Information Systems; University of South Florida, 2002.

\* cited by examiner

Fig. 2

```
! DLB2.IMT
! @(#) $Source: /cvs/sr/src/gemini/templates/db12.imt,v $ $Revision: 1.2 $ $Date: 199
! Intermodulation table for double balanced mixer #2
! Signal Level (dBm)    LO Level (dBm)
       -10              7
  M x LO ( Horizontal )    N x Signal (vertical )
\ 0   1    2    3    4    5    6    7    8    9    10   11   12   13   14   15
  99  39   42   46   58   37   65   49   75   62   72   61   70   57   87   60
  25   0   39   11   50   16   59   19   59   43   63   52   70   57   73
  68  67   76   67   80   66   82   66   83   72   84   72   82   70
  63  58   65   60   65   55   64   54   66   57   85   54   70
  96  80   96   80   95   82   98   78   90   95   95   95
  93  73   87   72   88   66   85   64   82   75   95
  99  99   99   99   99   99   99   99   99   99
  99  79   99   78   99   78   99   81   99
  99  95   99   95   99   95   99   95
  90  95   90   90   99   90
  99  99   99   99   99   99
  90  99   90   95   90
  99  99   99   99
  90  99   90
  99  99
  99
```

```
VAR RF_Frequency_value(1)=915000000
VAR RF_Power_value(1)=-20
VAR LO_Frequency_value(1)=985000000
VAR LO_Power_value(1)=-1.110223E-16
VAR UpperSB(0)=1

BEGIN IM_Table
%Index(0)  ConverLoss(1)  IMT_filename(2)
 1 0.3936  SLCR_P_Lower_1_-20.txt
END VAR RF_Frequency_value(1)=915000000
VAR RF_Power_value(1)=-20
VAR LO_Frequency_value(1)=985000000
VAR LO_Power_value(1)=-1.110223E-16
VAR UpperSB(0)=0

BEGIN IM_Table
%Index(0)  ConverLoss(1)  IMT_filename(2)
 1 0.2360  SLCR_P_Upper_1_-20.txt
END
```

| RF\LO | 0 | 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|---|---|
| 0 | 12 | 23 | 44 | 53 | 67 | 78 | 65 | 87 | 86 | 99 | 99 | 99 | 99 | 99 | 99 | 99 | 15 |
| 1 | 32 | 0 | 66 | 75 | 86 | 95 | 99 | 99 | 99 | 99 | 99 | 99 | 99 | 99 | 99 | 99 | 14 |
| 2 | 23 | 43 | 54 | 99 | 99 | 99 | 99 | 99 | 99 | 99 | 99 | 99 | 99 | 99 | 99 | 99 | 13 |
| 3 | 99 | 99 | 99 | 99 | 99 | 99 | 99 | 99 | 99 | 99 | 99 | 99 | 99 | 99 | 99 | 99 | 12 |
| 4 | 99 | 99 | 99 | 99 | 99 | 99 | 99 | 99 | 99 | 99 | 99 | 99 | 99 | 99 | 99 | 99 | 11 |
| 5 | 99 | 99 | 99 | 99 | 99 | 99 | 99 | 99 | 99 | 99 | 99 | 99 | 99 | 99 | 99 | 99 | 10 |
| 6 | 99 | 99 | 99 | 99 | 99 | 99 | 99 | 99 | 99 | 99 | 99 | 99 | 99 | 99 | 99 | 99 | 9 |
| 7 | 99 | 99 | 99 | 99 | 99 | 99 | 99 | 99 | 99 | 99 | 99 | 99 | 99 | 99 | 99 | 99 | 8 |
| 8 | 99 | 99 | 99 | 99 | 99 | 99 | 99 | 99 | 99 | 99 | 99 | 99 | 99 | 99 | 99 | 99 | 7 |
| 9 | 99 | 99 | 99 | 99 | 99 | 99 | 99 | 99 | 99 | 99 | 99 | 99 | 99 | 99 | 99 | 99 | 6 |
| 10 | 99 | 99 | 99 | 99 | 99 | 99 | 99 | 99 | 99 | 99 | 99 | 99 | 99 | 99 | 99 | 99 | 5 |
| 11 | 99 | 99 | 99 | 99 | 99 | 99 | 99 | 99 | 99 | 99 | 99 | 99 | 99 | 99 | 99 | 99 | 4 |
| 12 | 99 | 99 | 99 | 99 | 99 | 99 | 99 | 99 | 99 | 99 | 99 | 99 | 99 | 99 | 99 | 99 | 3 |
| 13 | 99 | 99 | 99 | 99 | 99 | 99 | 99 | 99 | 99 | 99 | 99 | 99 | 99 | 99 | 99 | 23 | 2 |
| 14 | 99 | 99 | 99 | 99 | 99 | 99 | 99 | 99 | 99 | 99 | 99 | 99 | 99 | 65 | 10 | 32 | 1 |
| 15 | 99 | 99 | 99 | 99 | 99 | 99 | 99 | 86 | 87 | 65 | 78 | 67 | 53 | 44 | 23 | 12 | 0 |
| | 15 | 14 | 13 | 12 | 11 | 10 | 9 | 8 | 7 | 6 | 5 | 4 | 3 | 2 | 1 | 0 | RF\LO |

Subtract

Sum

| Stimulus condition | RF Frequency | RF Power | LO Frequency | LO Power |
|---|---|---|---|---|
| | 915 MHz | -10 dBm | 985 GHz | 7 dBm |

| Stimulus condition | RF Frequency | RF Power | LO Frequency | LO Power |
|---|---|---|---|---|
| | 915 MHz | -20 – 1 dBm | 985 GHz | 0 – 10 dBm |

Fig. 17

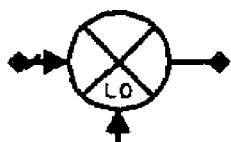

Mixer
MIX1
SideBand=UPPER
ImageRej=
LO_Rej1=
LO_Rej2=
RF_Rej=
ConvGain=dbpolar(0,0)
S11=polar(0,0)
S22=polar(0,180)
S33=0
PminLO=
NF=
NFmin=
Sopt=
Rn=
Z1=

Z2=
Z3=
GainCompType=LIST
GainCompFreq=
ReferToInput=OUTPUT
SOI=
TOI=
Psat=
GainCompSat=5.0 dB
GainCompPower=
GainComp=1.0 dB
GainCompFile=
ImpNoncausalLength=
ImpMode=
ImpMaxFreq=

ImpDeltaFreq=
ImpMaxOrder=
ImpWindow=
ImpRelTol=
ImpAbsTol=

Fig. 18

```
% File format constructed based on the parameter list of the Mixer model
% S11 S12 S13 S21 S22 S23 S31 S32 S33 Z1 Z2 Z3 SOI TOI GainCompPower GainComp
  XXX XXX XXX XXX XXX XXX XXX XXX XXX XXX XXX XXX XXX XXX XXX XXX
```

SYSTEM AND METHOD FOR CHARACTERIZING AND SIMULATING A FREQUENCY TRANSLATION DEVICE

CROSS REFERENCE TO RELATED APPLICATIONS

This application claims priority from a provisional application entitled "Method of Characterizing and Simulating Mixers," filed Oct. 15, 2002 by the present inventor and bearing application No. 60/319,618.

BACKGROUND OF INVENTION

Mixers are frequency translation devices that are widely used in communication, radar and electric warfare systems. Mixer performance depends on the power level and the frequency of the input and local oscillator signals. Because of the multiple degrees of freedom, mixers are difficult and time consuming to accurately characterize and model. The degrees of freedom include the power level and frequency of the input signal, radio frequency (RF) in down-converting application, or intermediate frequency (IF) in up-converting applications, and the local oscillator (LO) drive. Furthermore, the nonlinear devices inside the mixer circuits not only produce the desired translated signal, but also a multitude of harmonics and intermodulation products that make the modeling task increasingly difficult.

Generally, there are two ways to model mixers: circuit-level modeling and behavioral system modeling. Circuit-level modeling uses models for the internal components that comprise the mixer circuit. This must include accurate device models for the non-linear components used. Behavioral system modeling treats the mixer as a black box, using the external parameters of the mixer to describe its performance. This is of great importance, because often a system engineer has little circuit level information, yet requires accurate mixer system simulations. A variety of software packages are available to provide behavioral system mixer models. The models either depend upon polynomial functions or data files, such as intermodulation table (IMT) files to predict mixer performance. A conventional IMT file known in the art is a 2-dimensional table representing the relative amplitudes of the various frequency components, or spurs, appearing at the output of a mixer for a single specific set of input ($f_{RF}$) and LO ($f_{LO}$) frequency and power conditions according to the equation:

$$f_{spur} = |m \times f_{RF} \pm n \times f_{LO}|$$

Conventional IMT files used for mixer simulation store only the sum or difference intermodulation products under the assumption that the mixer is symmetrical, i.e. the corresponding sum and difference intermodulation products have the same amplitude. However, the assumption of symmetry does not always hold true. Current mixer modeling techniques known in the art do not address the multi-dimensional, dynamic and asymmetric nature of mixer output spectra.

Accordingly, what is needed in the art is an improved method for characterizing and modeling a device-under-test (DUT) over wide ranges of degrees of freedom. It is, therefore, to the effective resolution of the aforementioned problems and shortcomings of the prior art that the present invention is directed.

However, in view of the prior art in at the time the present invention was made, it was not obvious to those of ordinary skill in the pertinent art how the identified needs could be fulfilled.

SUMMARY OF INVENTION

The present invention relates to the characterization and system modeling of frequency translation devices. Specifically, the invention can be used to efficiently store and recall extensive datasets of measured behavior of the frequency translation devices in various applications. While the invention is presented as it applies to mixers, a typical frequency translation device widely used in communication systems and radar systems, the present invention is also effective for the characterization and system modeling of other frequency translation devices known in the art.

The present invention provides a new behavioral system mixer model that is based on measurement of the asymmetric intermodulation products at the output port of a mixer under varied frequency and power stimulus conditions. The new model, termed the Global Mixer Model (GMM), simulates mixer performance under varied signal conditions, and overcomes limitations due to symmetric assumptions made in commonly available mixer models. The GMM in accordance with the present invention is adaptable for use with both a custom simulator as well as commercial simulators known in the art.

According to the present invention a method for characterizing a frequency translation device is provided whereby a stimulus condition is supplied as input to a frequency translation device. The output spectrum of the frequency translation device is then measured and the intermodulation products identified. The intermodulation products include both a sum intermodulation product and a difference intermodulation product. In accordance with a predetermined file format, the sum intermodulation products and the difference intermodulation products are stored in files as a data set. An index file is then established to identify the intermodulation product files based on the stimulus input condition.

In a particular embodiment of the present invention, the frequency translation device is a mixer.

According to a particular embodiment of the present invention, the stimulus condition comprises a sweeping stimulus condition. With a sweeping stimulus condition an input signal at a predetermined power and frequency and a local oscillator input at a predetermined power and frequency are supplied. The input signal and local oscillator input are then stepped through a predetermined range of values to establish the sweeping stimulus condition.

Based upon the input stimulus condition, output intermodulation product measurements are taken. The intermodulation product measurements include both an amplitude measurement and a phase measurement. The amplitude measurements or the amplitude and phase measurements are then recorded in an intermodulation table. The present invention takes into account the situation wherein the frequency translation device is not symmetric and therefore the sum intermodulation products differ from the difference intermodulation products. To account for this distinction, the sum intermodulation products and the difference intermodulation products are stored and identified separately. In one embodiment, the sum and difference intermodulation products are stored in separate files and identified by a variable. In an additional embodiment, the sum and difference intermodulation products are stored in distinct locations within the same file and identified by a variable as required. The variable is assigned and stored to distinguish the sum intermodulation products from the difference intermodulation products.

After the frequency translation device is characterized and the intermodulation products stored and the index file established, a method to simulate the expected response of a frequency translation device is provided. Simulating the response of the frequency translation device includes providing a simulated stimulus condition, relating the stimulus condition to the appropriate stored intermodulation table through the index file, and extracting the stored information to display the results of the simulation. The simulated stimulus condition may be either a static stimulus or a sweeping stimulus condition. The display provided may take on a variety of forms, including both 2-dimensional and 3-dimensional graphs. In the situation whereby the simulated stimulus condition does not have an exact correspondence in the stored data, interpolation methods can be used on the extracted data to display the requested condition.

In accordance with the present invention, a system for characterizing and simulating a frequency translation device is provided, the system includes a stimulus supply to supply a stimulus condition input to the frequency translation device, an output measurement device to measure a plurality of intermodulation products in the output spectrum of the frequency translation device resulting from the stimulus condition input, the plurality of intermodulation products further comprising a plurality of sum intermodulation products and a plurality of difference intermodulation products, a predetermined file format to store the plurality of sum intermodulation products and the plurality of difference intermodulation products in a plurality of files according to the predetermined file format and an index file to identify the stored output files, the stored output files identified by the supplied stimulus condition.

In one embodiment of the present invention, the frequency translation device is a mixer and the stimulus condition is a sweeping stimulus condition. The stimulus supply may consist of a plurality of signal generators to provide the required stimulus conditions for the input signal and local oscillator. A spectrum analyzer may be provided as the output measurement device to measure the amplitude intermodulation products of the output spectrum. The intermodulation products are stored in the appropriate intermodulation table and the sum and difference products are further identified by a unique variable. An index file is established to associate the intermodulation table files.

In addition to the characterization elements of the system, the present invention also includes simulation capability to simulate an expected response to a simulated stimulus condition. According to the present invention, a simulated stimulus condition selector is provided, the selected stimulus condition identifies the index file, the index file identifies and extracts the intermodulation product of interest from the stored data files associated with the simulated stimulus condition, and a display is provided to display the result of the simulation. The simulated condition may be static or a sweeping stimulus condition.

While specific examples have been provided for a mixer, it is within the scope of the present invention to adapt the present invention for use with other frequency translation devices.

An advantage of the present invention is, the establishment and utilization of an efficient indexing scheme to store, recall and interpolate using large amounts of measured datasets of the device under test. This indexing scheme provides a way to explore the performance of the device under test based on the measured datasets, which are the best representation of the device.

Another advantage provided by the present invention, is the ability to effectively characterize and simulate asymmetrical frequency translation devices through the use of a novel file and indexing system that can accommodate both the sum intermodulation products and the difference intermodulation products.

An additional advantage includes the incorporation of a display scheme to provide increased capabilities to explore the performance of the device from many perspectives through the use of 2-dimensional and 3-dimensional display, which is not possible with systems known in the art.

BRIEF DESCRIPTION OF DRAWINGS

For a fuller understanding of the nature and objects of the invention, reference should be made to the following detailed description, taken in connection with the accompanying drawings, in which:

FIG. 2 illustrates an IMT file of a double-balanced mixer in accordance with the present invention;

FIG. 3 illustrates an excerpt from the indexing file in accordance with the present invention;

FIG. 4 illustrates a new IMT file format in accordance with the present invention in which both the sum and difference intermodulation products are stored in the same data file;

FIG. 17 illustrates a sample set of parameters for the mixer model in accordance with the present invention;

FIG. 18 illustrates a sample file format based on the mixer model in accordance with the present invention.

DETAILED DESCRIPTION

As known in the art, there are generally two ways to model a mixer: circuit-level modeling and system-level modeling, also known as black-box or behavioral modeling. Circuit-level modeling handles the mixer from inside and constructs an equivalent model for components in the mixer circuit to simulate the mixer performance accurately. System-level modeling treats the mixer as a black box, using the external parameters of the mixer to describe the performance of the mixer. The present invention utilizes the system-level modeling technique to create a mixer model that can predict the mixer performance accurately based on the measurement dataset.

According to the present invention, a new mixer model is provided termed the Global Mixer Model (GMM). In general the GMM can be divided into two parts: the indexing scheme file and the measured data files. Each of the measured data files has a record in the indexing scheme file. The data files are recalled based on the stimulus condition of the measurement taken, i.e. relying on the power and frequency of the input signal and local oscillator drive.

Figure 1:
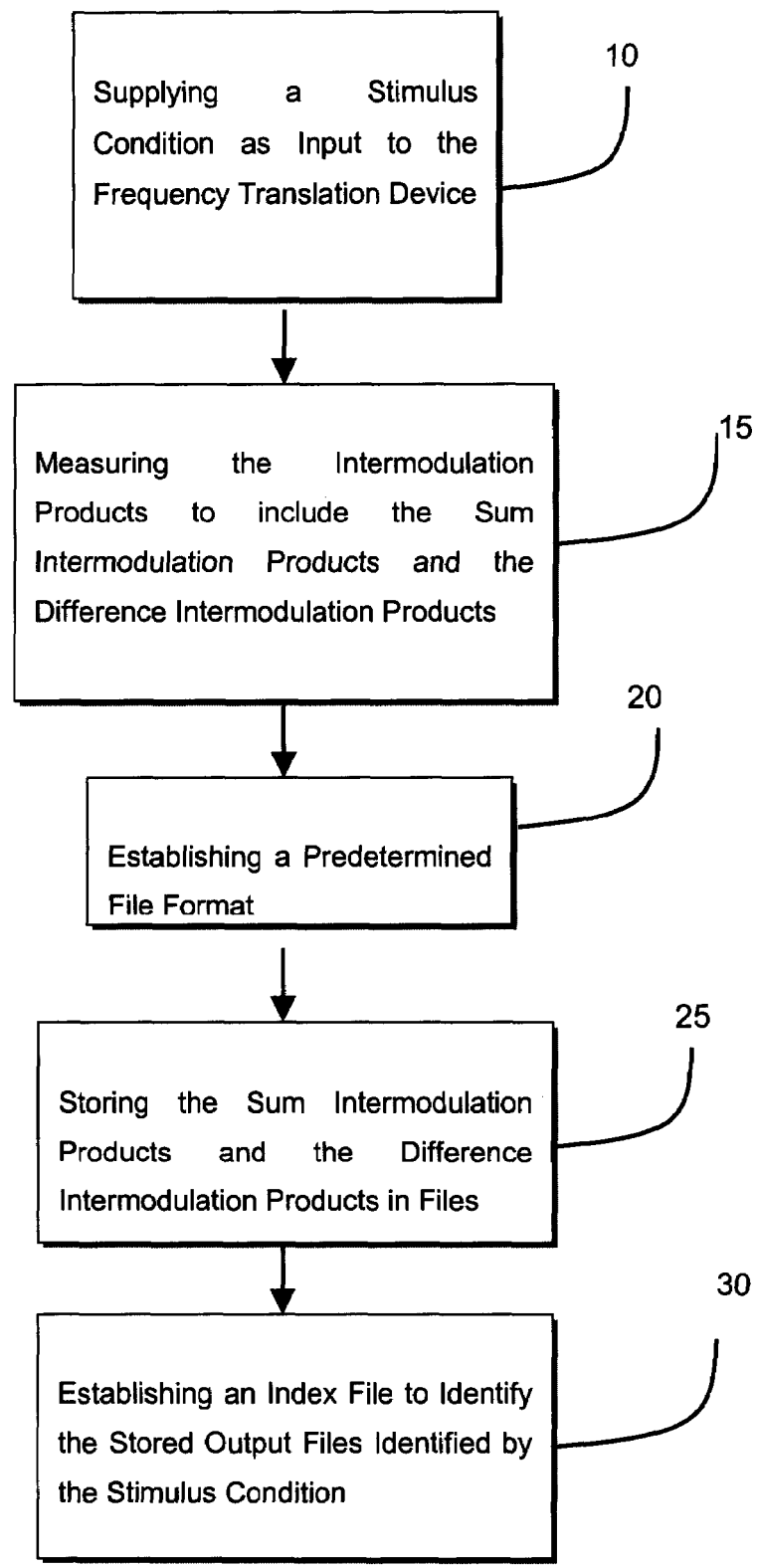
FIG. 1 is a flow diagram of the characterization method in accordance with the present invention.

With reference to FIG. 1, a method for characterizing a frequency translation device is provided including the steps of supplying a stimulus condition as input to a frequency translation device 10, measuring a plurality of intermodulation products in the output spectrum of the frequency translation device, the plurality of intermodulation products including both sum intermodulation products and difference intermodulation products 15, establishing a predetermined file format 20, storing the plurality of sum intermodulation products and the plurality of difference intermodulation products in a plurality of output files 25, and establishing an index file to identify the stored output files 30.

In accordance with the present invention, the intermodulation products, which are also known in the art as spurious products or spurs are used to characterize the device under test. For each combination of input frequency, RF or IF, and LO frequency, there are a set of intermodulation products at the output port, which can be represented as:

$$f_{spur} = m \times f_{IN} \pm n \times f_{LO}$$

where m and n stand for the harmonic orders of the input and LO signals, $f_{spur}$, $f_{IN}$ and $f_{LO}$ are the frequency of the spurs, input signal and LO signal respectively. For the down-conversion setup the RF signal, $f_{RF}$, is the input signal, $f_{IN}$. The IF frequency, $f_{IF}$, replaces the $f_{IN}$ in the equation if the up-conversion setup is of interest.

The IMT file stores the amplitude information of the intermodulation products presented in the output spectrum of a mixer under a specific stimulus condition according to the LO order and input signal order, so that by specifying the orders of the mixing signals, the corresponding value can be retrieved. An example IMT file of a double-balanced mixer is shown in FIG. 2. According to this example, the input signal power level 35 is 10 dBm and LO level 40 is 7 dBm. The LO order increases horizontally 45 and the input signal order increases vertically 50. Notice that the value of the 1×1 intermodulation product, i.e. IF (for down-conversion) or RF (for up-conversion), is 0, which means the values in the table are in dBc, compared to the IF (down-conversion) or RF (up-conversion) power level.

The IMT file format is widely used in CAE software packages, however, its limitation is that it assumes symmetric Intermodulation products and therefore stores only the sum or difference intermodulation products. This method of storing intermodulation products is only effective if the mixer under test is symmetrical, i.e. the corresponding sum and difference intermodulation products have the same amplitude and therefore follow the equation:

Amplitude of $m \times f_{IN} + n \times f_{LO}$ = Amplitude of $m \times f_{IN} - n \times f_{LO}$ However, symmetry does not always hold true regarding frequency translation devices. As such, to effectively characterize a mixer, it is necessary to address this limitation of the IMT file format known in the art. In accordance with the present invention, a variable is used to point out whether the sum products or difference products are inspected. An example of such an index file is shown in FIG. 3 as 55, wherein the index variable (UpperSB) identifies the intermodulation products as sum or difference products. Additionally, in accordance with the present invention, a modified IMT file format is presented which stores both the sum and difference intermodulation products in the same data file as shown in FIG. 4. The upper triangle 60 stores the amplitude information of the difference intermodulation products, while the lower triangle 65 stores that of the sum products. The IMT file, as well as the modified IMT file, stores only the amplitude information of the intermodulation products. Sometimes the phase information of the spur products is also of interest, especially in digital modulation in which the phase has a great effect on the baseband data detection. With the proper instrument setup and measurement procedure, the amplitude and phase information of the output spectrum can be determined and the complex values can be stored in the table cells in the IMT files to enable the phase simulation. Incorporation of a vector network analyzer into the measurement system will provide the proper setup to obtain the phase information.

In accordance with the present invention, measurements of the output amplitude spectrum of the mixer under swept stimulus conditions are taken and the historical intermodulation table, IMT, file format is used to store the obtained data.

Figure 5:
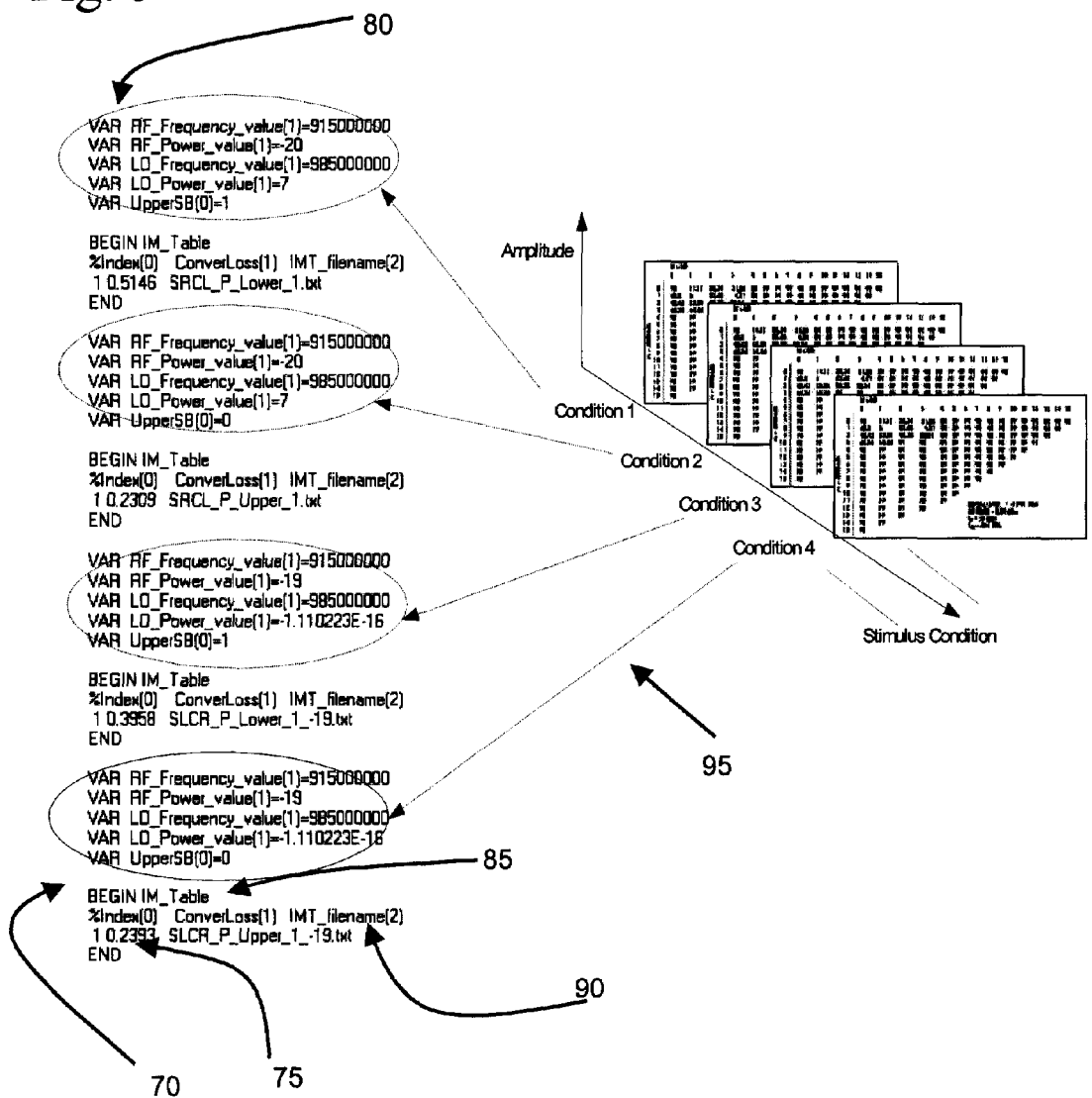
FIG. 5 illustrates the indexing process in accordance with the present invention.

FIG. 5 illustrates the indexing process in accordance with the present invention. The indexing scheme behaves as the coordination system, which can retrieve the IMT data files according to the stimulus conditions. In accordance with the present invention, the indexing scheme file follows the widely used microwave data interface file format, MDIF. MDIF is made of data blocks that are separated by BEGIN 70 and END 75 statements. Each data block can be indexed through variable information that is started with VAR reserve word 80 for MDIF file format. FIG. 5 shows an excerpt from the indexing file. The file contains two data blocks that are confined between the BEGIN and END statements. In the data block, the conversion loss value 85 (not in dB) and the IMT file name 90 are given. Each data block has an index 95 that is composed of five variables, which specify the stimulus condition and other considerations.

Figure 6:
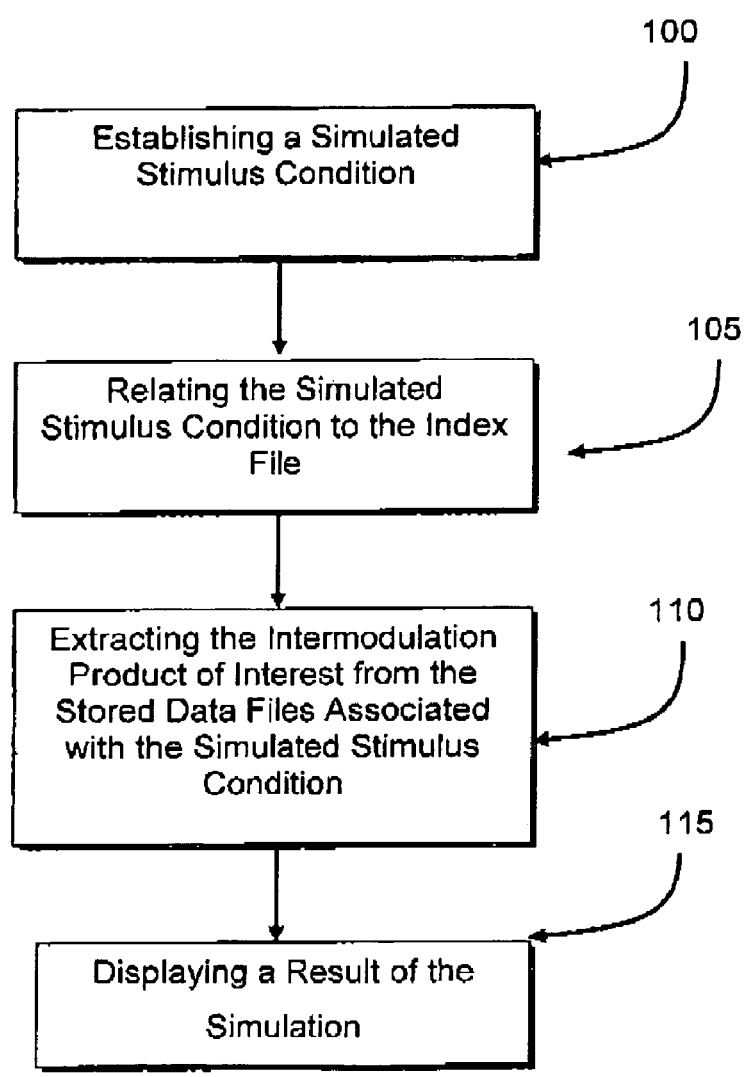
FIG. 6 is a flow diagram of the simulation method in accordance with the present invention.

After establishment of the IMT files and the indexing file completes characterization of the mixer, the method in accordance with the present invention further includes simulating the response of the frequency translation device to a simulated stimulus condition. With reference to FIG. 6, simulating the response includes, establishing a simulated stimulus condition 100, relating the stimulated stimulus condition to the index file 105, extracting the intermodulation product of interest from the stored data files associated with the simulated stimulus condition 110, and displaying a result of the simulation 115. Once the indexing file is specified, one can view the performance of the mixer in different ways. Utilizing a customized user interface, the user can choose to view the measured data either under sweeping conditions or in a static condition. One can also choose to view one frequency component in the output spectrum three-dimensionally, or compare the trends of several spurs under one sweeping parameter. Linear interpolation is used when the data for the specified condition is not available in the measurement set. More complex interpolation methods are also within the scope of the present invention.

Figure 7:
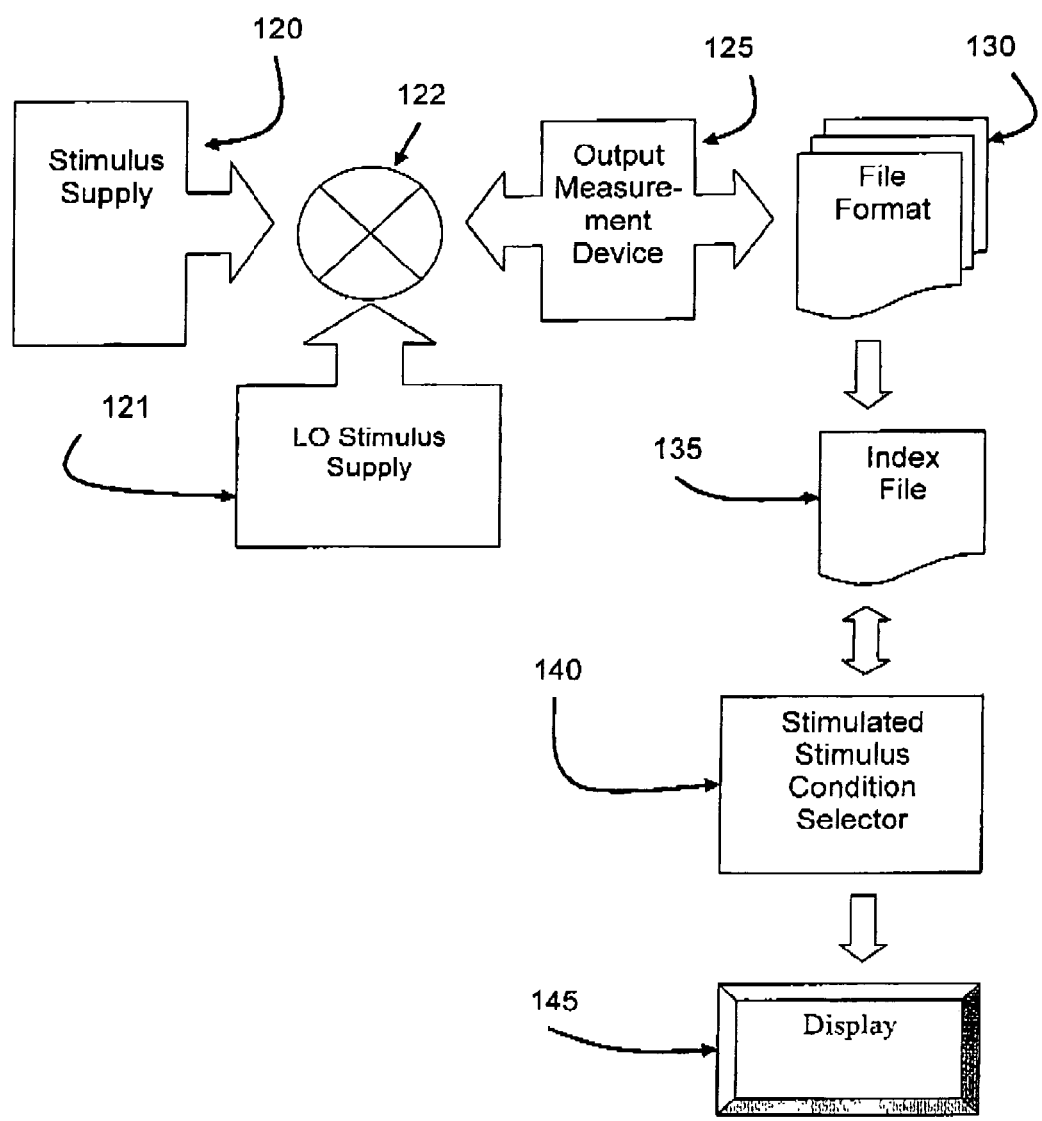
FIG. 7 is a diagrammatic view of the system in accordance with the present invention.

In accordance with the present invention, a system for characterizing and simulating a frequency translation device is provided as shown in FIG. 7, including stimulus supplies 120/121 to supply the stimulus condition input to the frequency translation device 122, an output measurement device 125 to measure a plurality of intermodulation products in the output spectrum of the frequency translation device resulting from the stimulus condition input, the plurality of intermodulation products further comprising a plurality of sum intermodulation products and a plurality of difference intermodulation products, a predetermined file format 130 to store the plurality of intermodulation products, an index file 135 to identify the stored output files, a simulated stimulus condition selector 140 to identify and extract the intermodulation product of interest from the stored data files and a display 145. The simulated stimulus condition selector 140 it used to access the model and extract information from the model. The simulator reads the indexing files as well as the measured data files according to different requirements. As an example, the stored data may be sent to an interface provided by MATLAB™. MATLAB™ is used because of its power in data graphing. By specifying the index data file through the MATLAB interface, one can obtain the knowledge of the sweeping stimulus conditions taken in the measurement.

In a specific example in accordance with the present invention, measurements are taken on a mixer and the measured data arranged according to the global mixer model requirement of the present invention. The simulator is then used to replicate and predict the performance of the mixer. In this example, the power levels of the input signal 120 and LO drive 121 are swept and the frequencies are kept constant. In this example, the mixer is used as a downconverter.

Figure 8:
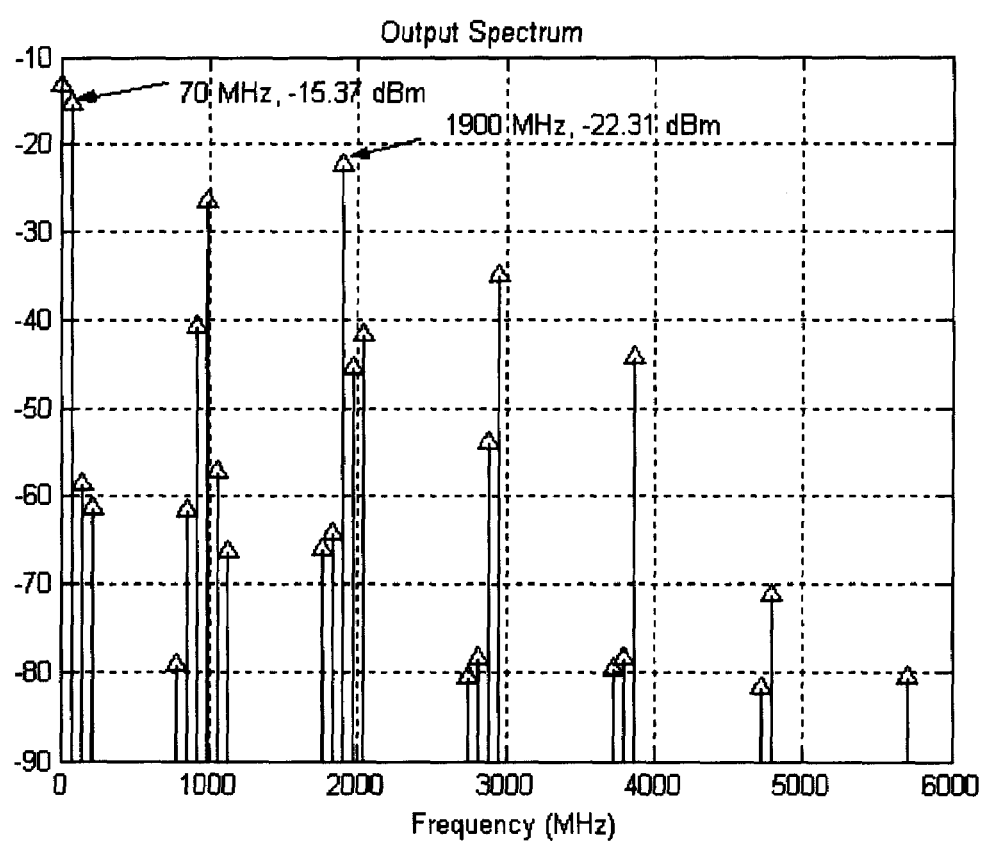
FIG. 8 illustrates a simulated output spectrum in accordance with the present invention.

To view the output spectrum under this static stimulus condition, a setup screen is used to supply the static stimulus condition including the input signal frequency and power level and the LO signal frequency and power level. In this example, RF signal has a power level at −10 dBm at 915 MHz and the LO drive has power at 7 dBm at 985 MHz. FIG. 8 illustrates the simulated output spectrum under these conditions. According to the result, it can be observed that the power levels of the difference components are different from that of the sum components. The IF component (70 MHz) has a power level of −15.37 dBm compared to the sum component (1900 MHz) whose power level is −22.31 dBm. By combining IMT files for sum and difference components, the simulator in accordance with the present invention can predict the output spectrum accurately. However, in present commercial CAE packages, only a single IMT data file is considered, so that when used to simulate the asymmetric mixers, they are not able to distinguish the sum and difference components and the amplitude of the components are predicted to be the same.

Figure 9:
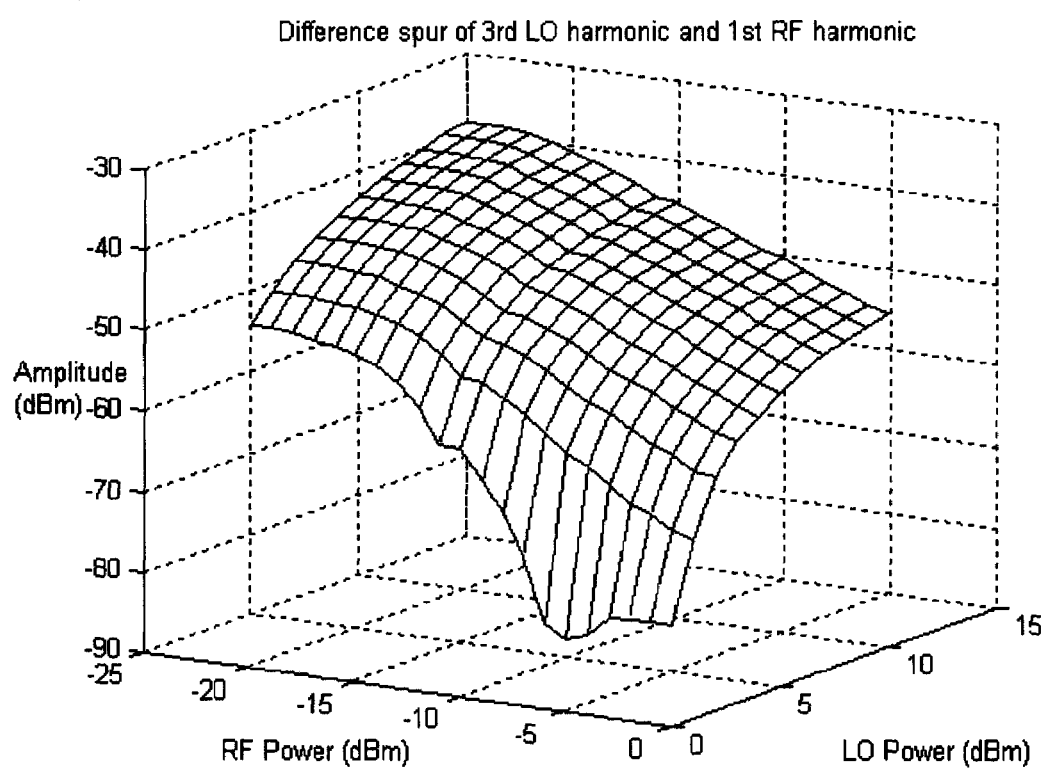
FIG. 9 illustrates a three-dimensional graph of the simulated result in accordance with the present invention.
Figure 10:
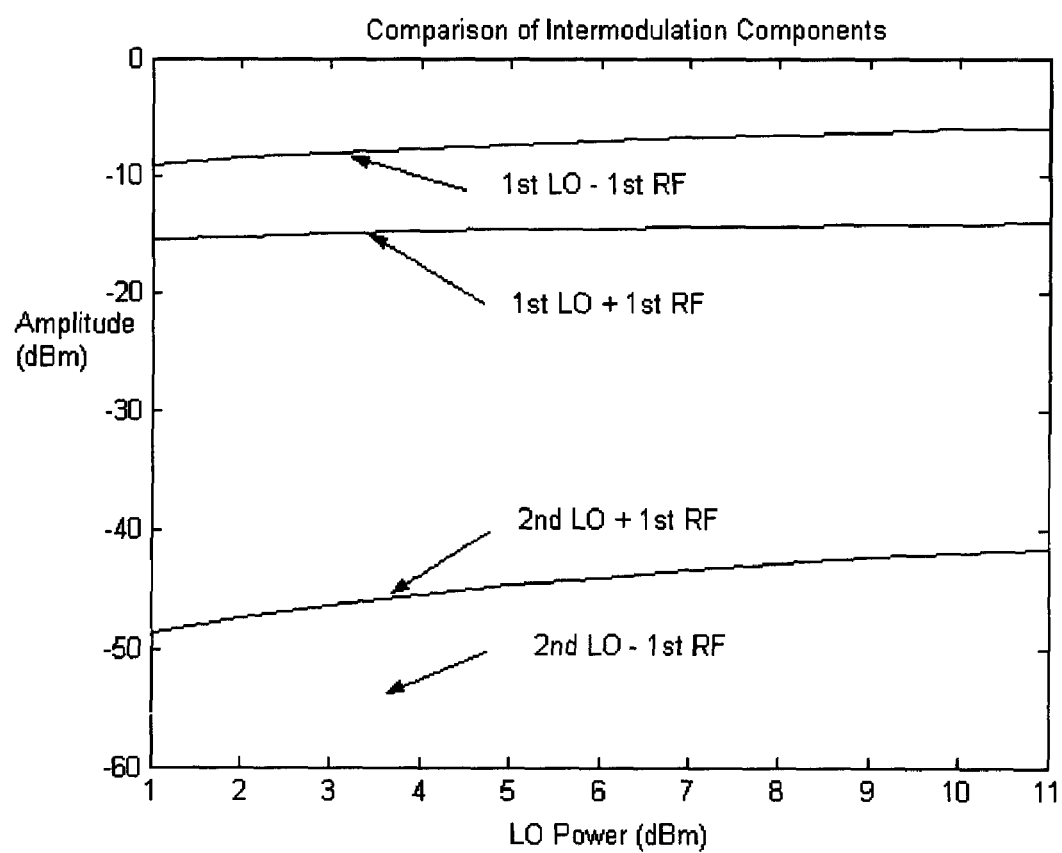
FIG. 10 illustrates an example of a simulated result that compares four intermodulation products in accordance with the present invention.
Figure 11:
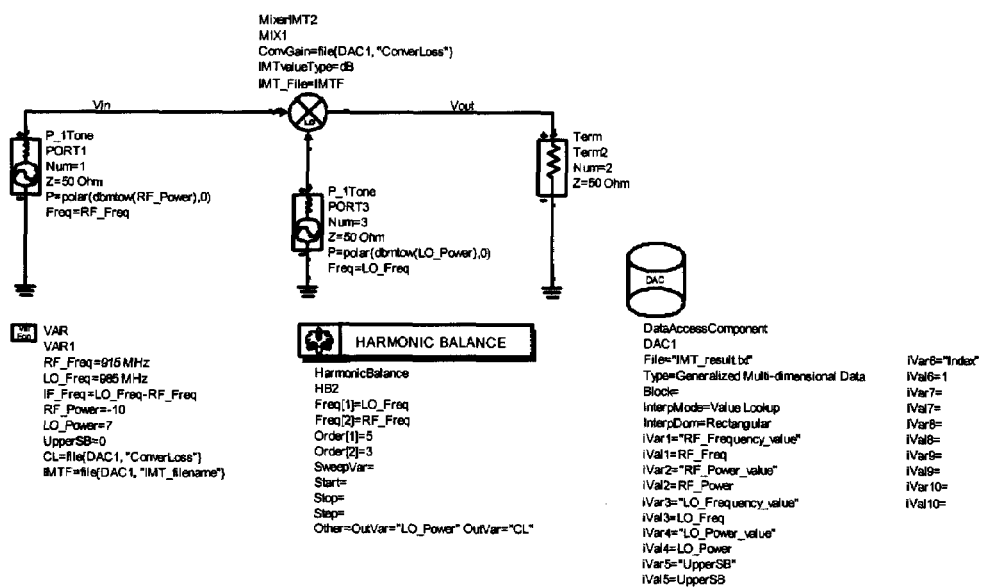
FIG. 11 illustrates a simulation schematic under a static stimulus condition in accordance with the present invention.
Figure 12:
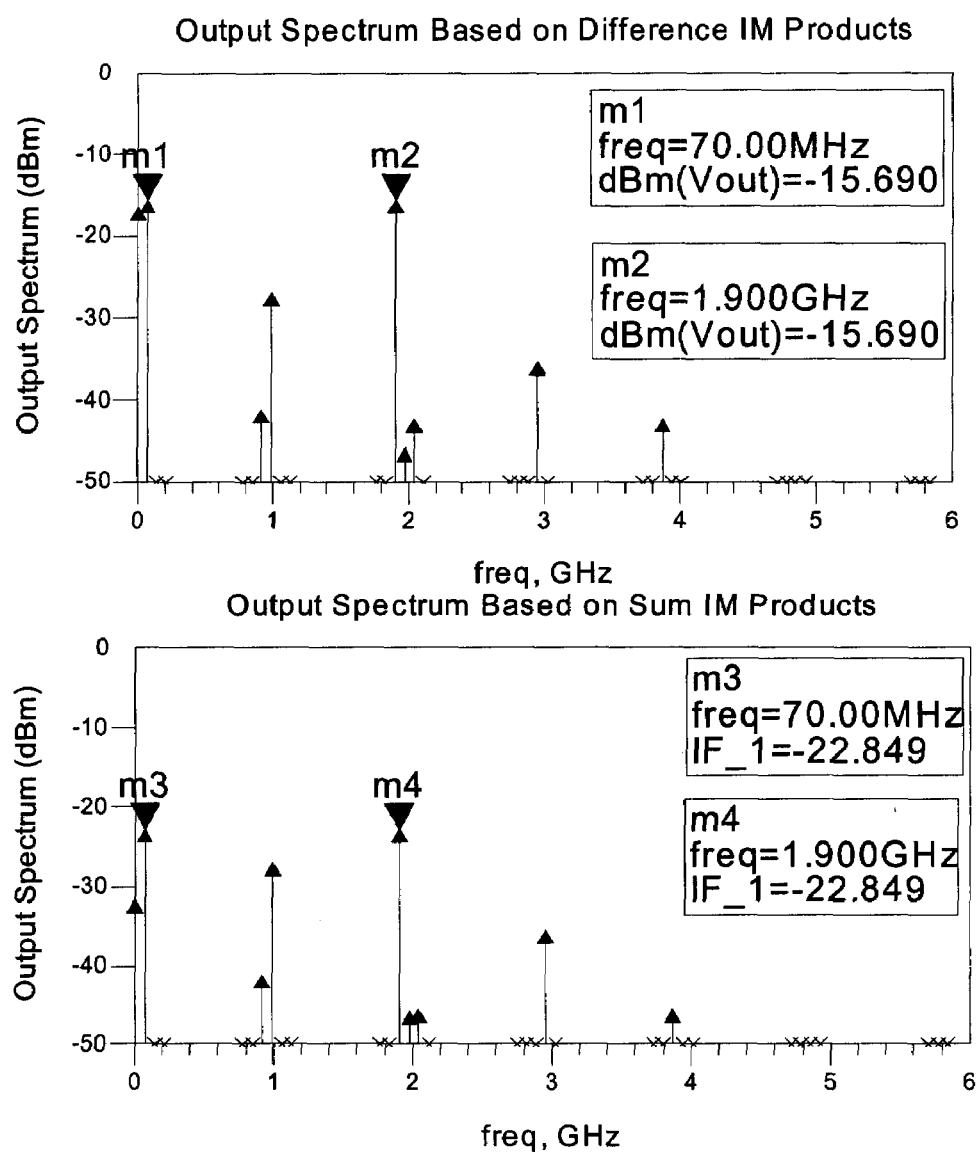
FIG. 12 illustrates two sets of the simulated output spectrum in accordance with the present invention.
Figure 13:
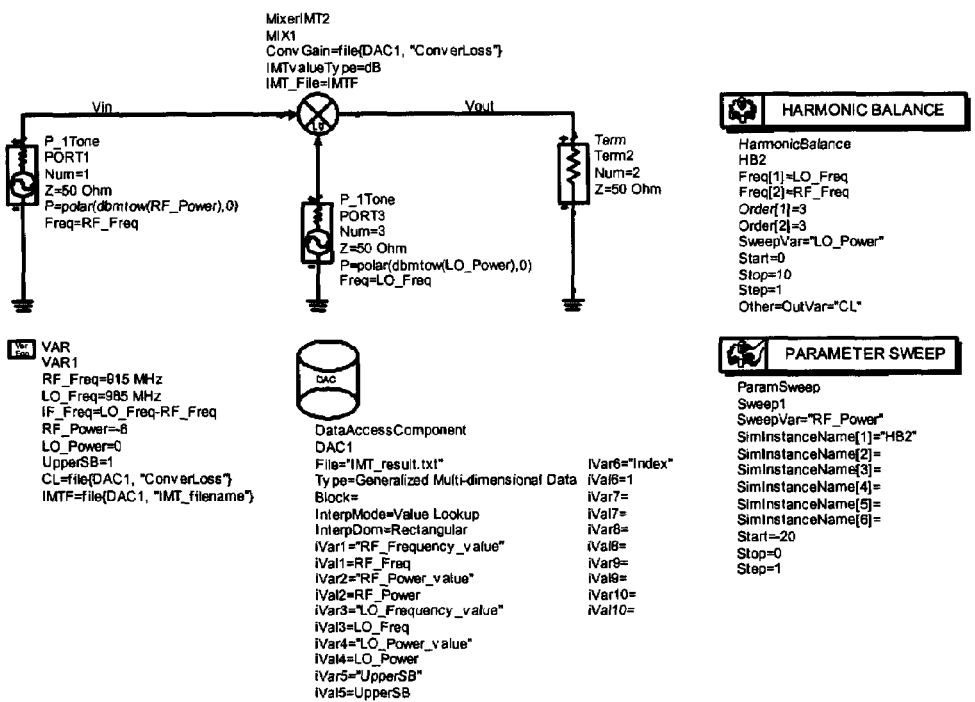
FIG. 13 illustrates a simulation schematic under a swept stimulus condition in accordance with the present invention.
Figure 14:
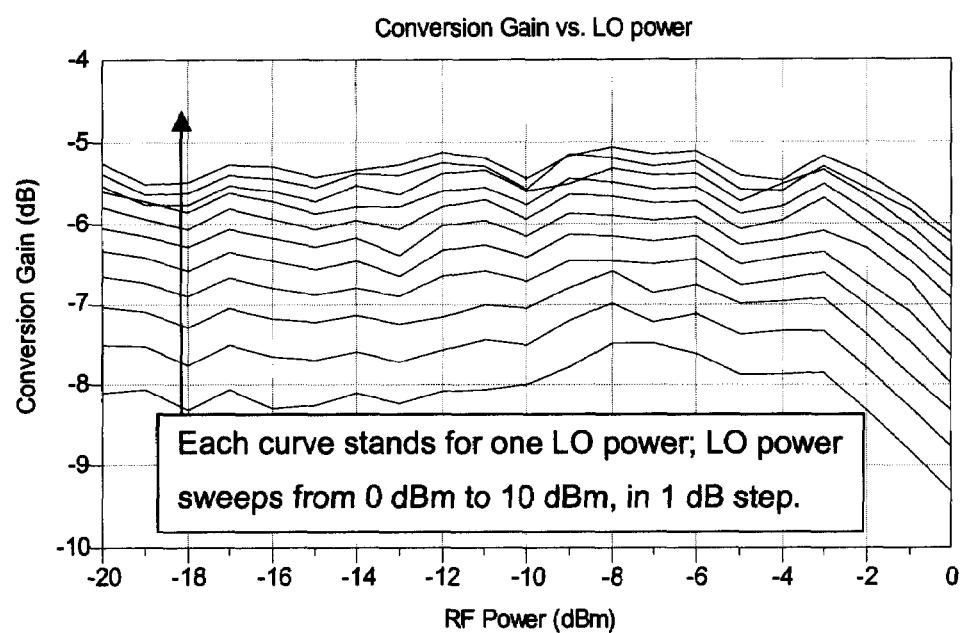
FIG. 14 illustrates the simulated conversion loss under swept LO power and RF power in accordance with the present invention.
Figure 15:
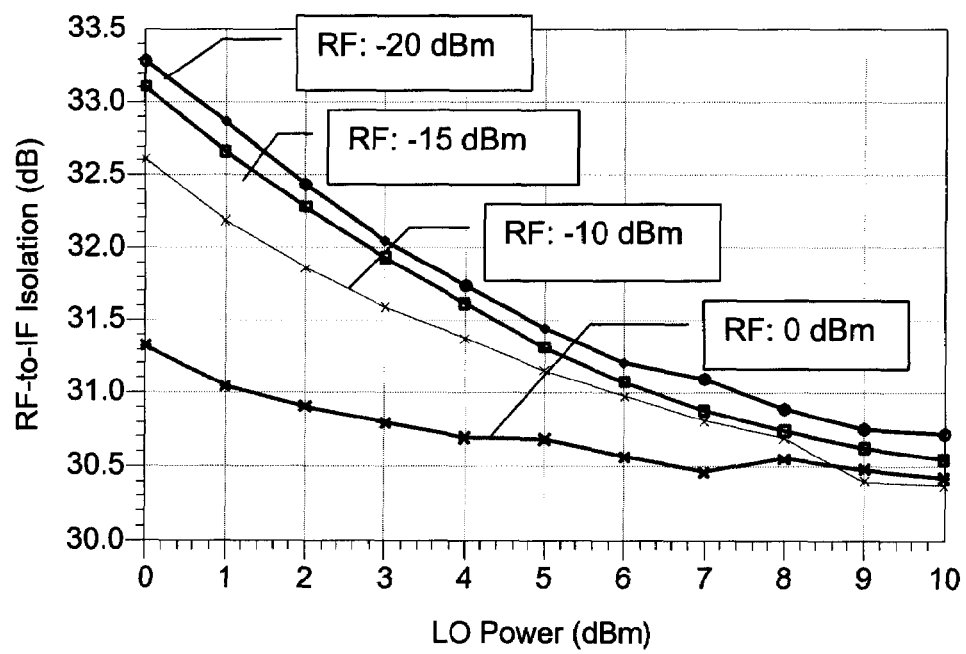
FIG. 15 illustrates the relationship of the isolation between LO and IF ports with the swept LO/RF power in accordance with the present invention.
Figure 16:
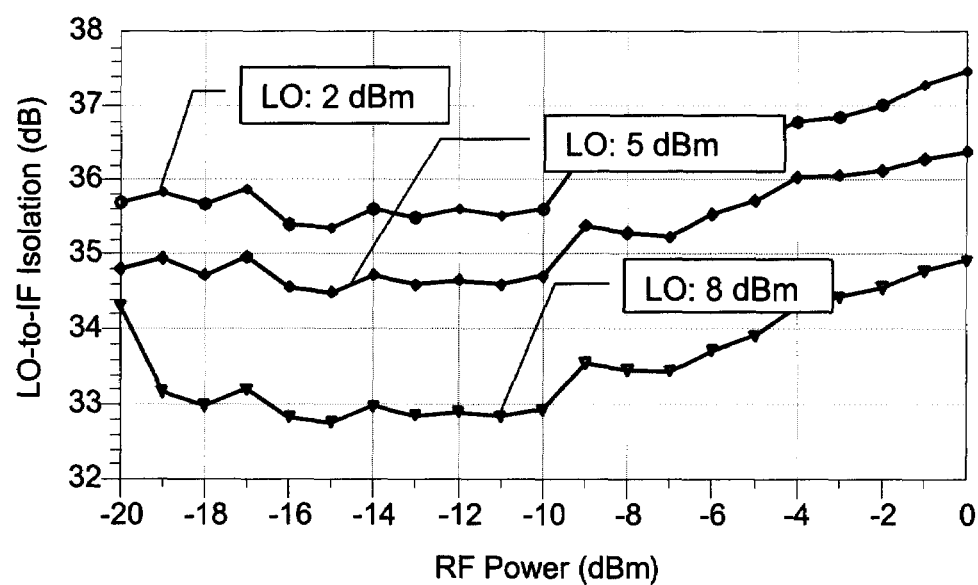
FIG. 16 illustrates the relationship of the isolation between RF and IF ports with the swept LO/RF power in accordance with the present invention.

In accordance with the present invention, the user can also analyze a specific spur component in a three-dimensional graph. By selecting the frequency component of interest from the interface of the simulator and specifying the sweeping condition, the three-dimensional graph illustrated in FIG. 9 results. In this figure, the changing trend of the difference intermodulation product of the $3^{rd}$ LO harmonic and $1^{st}$ RF harmonic is observed. The simulator system of the present invention also allows for the analysis of changing trends of several spur components against one sweeping parameter at the same time. FIG. 10 gives an example of a simulated result that compares four intermodulation products, sum and difference of the $2^{nd}$ LO harmonic and $1^{st}$ RF harmonic; sum and difference of the $1^{st}$ LO harmonic and $1^{st}$ RF harmonic, against sweeping LO power level. As can be seen from the example graphs presented, the global mixer model in accordance with the present invention provides the flexibility to analyze the mixer from different angles and different approaches. In addition to a customized simulator, the global mixer model in accordance with the present invention is readable adaptable for integration with other CAE packages. Incorporation of the present invention with a computer aided engineering package known in the art is shown with reference to FIG. 11, wherein a static stimulus condition is presented. The model utilizes IMT data files provided to predict the performance of the mixer under test. Two sources are connected to the input port and LO port of the model. A Harmonic Balance simulator is used in this simulation because of its fast speed and advantage in harmonic prediction. A Data Access Component (DAC) is used in this simulation to access the MDIF indexing file according to the stimulus condition specified in its indexing value lists, the DAC can retrieve a record, which includes the value of the conversion loss and the file name of the IMT data file corresponding to the condition. The resulting simulation is illustrated in FIG. 12 wherein two sets of the simulated output spectrum are presented. One is based on the difference IMT data file and the other is based on the sum IMT data file. To simulate the performance of a mixer under swept stimulus condition, a new schematic is constructed which is shown in FIG. 13. A Parameter Sweep controller is used in the schematic to manage the swept condition. In FIG. 14 the simulated conversion loss under swept LO power and RF power is given out. Note that in these simulations the same GMM data files are used. FIG. 15 shows the relationship of the isolation between LO and IF ports with the swept LO/RF power. FIG. 16 shows the relationship of the isolation between RF and IF ports with the swept LO/RF power. As we can see, the GMM model can easily be integrated with a commercial simulator and it enables the user to study the mixer under test in a broad range.

While the global mixer model of the present invention is described using the traditional IMT data files to represent the performance of a mixer, it is not limited to the IMT file format. Other customized filed formats are within the scope of the present invention. Additional specified and measured data can be stored and the GMM still can to utilized to read and replicate the measured data through the efficient indexing scheme. The modified IMT file format mentioned above is an example file format that can be used in this model. Other possible data file formats are the outcome of the simulation requirements. For example, an engineer may want to utilize the indexing power enabled by the GMM together with the mixer models embedded in the CAE package to fully simulate the performance of the mixer under test. Therefore, the variables in the data file are based on the parameter lists of the mixer model studied. As an illustration, the parameters of a known mixer model are as shown in FIG. 17, and are used to establish a customized file format. The measurable parameters of the mixer model include the conversion loss, S-parameter, port impedances, SOI and TOI, power at the gain compression and the compression in the gain. As such, the file format is constructed as shown in FIG. 18. MDIF indexing file can keep the same as shown in FIG. 5. The only change is that the file name stored is no longer the name for the IMT file, but is instead the file name of the data file shown in FIG. 18.

Figure 19:
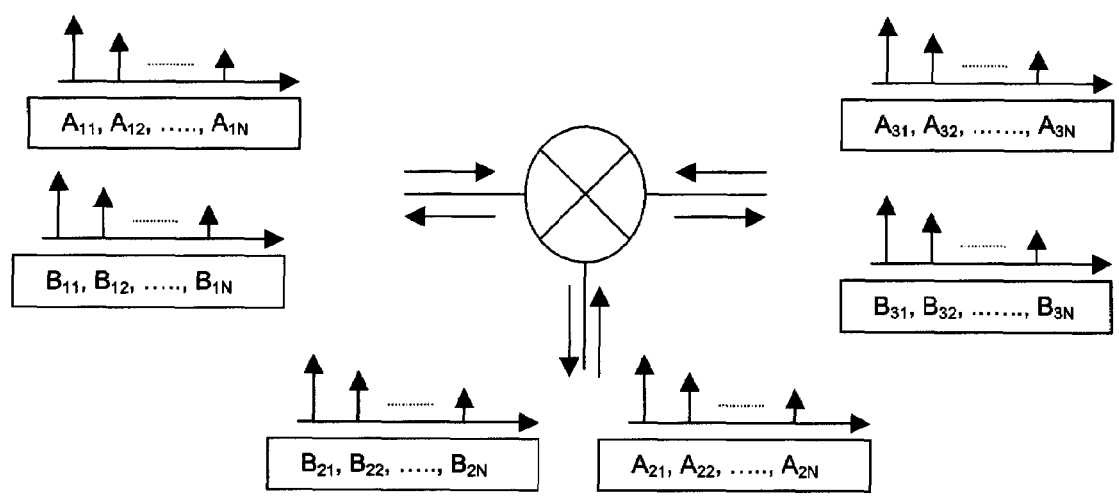
FIG. 19 illustrates a representation of the mixer's performance using traveling voltage/current waves in accordance with the present invention.

The present invention can also be extended into the large signal network analysis (LSNA) of a mixer. Basically, LSNA is to measure and utilize the input and reflected voltage waveforms present at each port of a device to represent the performance of the device, as shown in FIG. 19. The incident and reflected voltage waveforms are defined as a and b, with subscripts pointing out the port number and harmonic order. For example a11 defines the incident voltage wave at the port 1 at the $1^{st}$ order of the fundamental frequency.

The GMM model of the present invention provides a powerful representation of a mixer base on the ability to index and access large sets of measured data files and increased flexibility in data file formats. Through the indexing scheme provided by the GMM, one can retrieve the components of interest from the output spectrum and analyze them versus swept stimulus conditions, or compare them with other components present at the output spectrum. The multi-tone intermodulation distortion is one area that the GMM can be utilized. The intermodulation distortion incurred by the multiple tones is an important issue to evaluate the Adjacent Channel Power Ratio (ACPR) and Complementary Cumulative Distribution Function (CCDF) in current wireless communication systems. Because of the involvement of multiple tones present at the input port, the indexing scheme needed to address them is increasingly complex. The complexity in the computation of the intermodulation products also incurs the need for an efficient data file format.

It will thus be seen that the objects set forth above, and those made apparent from the foregoing description, are efficiently attained. Since certain changes may be made in the foregoing construction without departing from the scope of the invention, it is intended that all matters contained in the foregoing construction or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall there between.

The invention claimed is:

1. A method for characterizing a frequency translation device, the method comprising:
   supplying a stimulus condition as input to the frequency translation device to generate an output spectrum;
   measuring a plurality of intermodulation products in the output spectrum of the frequency translation device resulting from the stimulus condition input, the plurality of intermodulation products further comprising a plurality of sum intermodulation products and a plurality of difference intermodulation products;
   establishing a predetermined file format;
   storing the plurality of sum intermodulation products and the plurality of difference intermodulation products in a plurality of output files according to the predetermined file format;
   assigning a variable to identify the intermodulation products stored in each of the plurality of output files as a sum intermodulation product or a difference intermodulation product; and
   establishing an index file to identify the stored output files, wherein the index file comprises at least one variable associated with the stimulus condition that identifies the stored output files associated with the stimulus condition.

2. The method of claim 1, wherein the frequency translation device is a mixer.

3. The method of claim 1, wherein supplying the stimulus condition further comprises supplying a sweeping stimulus condition.

4. The method of claim 3, wherein supplying the sweeping stimulus condition further comprises supplying an input signal at a predetermined power and frequency and establishing a local oscillator input at a predetermined power and frequency and stepping the input signal and local oscillator power through a predetermined range of values.

5. The method of claim 4, wherein supplying the sweeping stimulus condition further comprises supplying an input signal at a first frequency and a local oscillator input at a second frequency, stepping the input signal power level through a predetermined first range of values, and stepping the local oscillator power level through a predetermined second range of values.

6. The method of claim 1, wherein measuring the plurality of intermodulation products further comprises measuring the amplitude of the intermodulation products.

7. The method of claim 1, wherein measuring the plurality of intermodulation products further comprises measuring the amplitude and phase of the intermodulation products.

8. The method of claim 1, wherein establishing a predetermined file format further comprises establishing a predetermined file format whereby the sum intermodulation products and the difference intermodulation products are stored within the same file.

9. The method of claim 1, wherein establishing a predetermined file format further comprises establishing a predetermined file format whereby the sum intermodulation products and the difference intermodulation products are stored within separate files.

10. The method of claim 1, further comprising storing the assigned variable with the intermodulation product.

11. The method of claim 1, wherein establishing an index file to identify the stored output files further comprises establishing the index file in accordance with a microwave data interface file format.

12. The method of claim 1, further comprising the step of simulating an expected response of the frequency translation device to a simulated stimulus condition.

13. The method of claim 12, wherein the step of simulating an expected response of the frequency translation device to a simulated stimulus condition further comprises:
   using the simulated stimulus condition as the at least one variable of the index file to identify the stored output files associated with the simulated stimulus condition;
   extracting the intermodulation products from the stored output files that are associated with the simulated stimulus condition; and
   displaying the extracted intermodulation products to provide an expected response of the frequency translation device to the simulated stimulus condition.

14. The method of claim 13, wherein the simulated stimulus condition further comprises a simulated sweeping stimulus condition.

15. The method of claim 13, wherein extracting the intermodulation products from the stored data files further comprises utilizing interpolation to extract the intermodulation products based on the simulated stimulus condition.

16. The method of claim 13, wherein displaying the extracted intermodulation products further comprises displaying the extracted intermodulation products in a graphical format.

17. The method of claim 16, wherein the graphical format is three-dimensional.

18. A method for characterizing and simulating a frequency translation device, the method comprising:
supplying a stimulus condition as input to the frequency translation device to generate an output spectrum;
measuring a plurality of intermodulation products in the output spectrum of the frequency translation device resulting from the stimulus condition input, the plurality of intermodulation products further comprising a plurality of sum intermodulation products and a plurality of difference intermodulation products;
establishing a predetermined file format;
storing the plurality of sum intermodulation products and the plurality of difference intermodulation products in a plurality of output files according to the predetermined file format;
assigning a variable to identify the intermodulation products stored in each of the plurality of output files as a sum intermodulation product or a difference intermodulation product; and
establishing an index file to identify the stored output files, wherein the index file comprises at least one variable associated with the stimulus condition that identifies the stored output files associated with the stimulus condition;
establishing a simulated stimulus condition;
using the simulated stimulus condition as the at least one variable of the index file to identify the stored output files associated with the simulated stimulus condition;
extracting the intermodulation products from the stored output files that are associated with the simulated stimulus condition; and
displaying the extracted intermodulation products to provide an expected response of the frequency translation device to the simulated stimulus condition.

19. A system for characterizing a frequency translation device, the system comprising:
a stimulus supply to supply a stimulus condition input to the frequency translation device to generate an output spectrum;
an output measurement device to measure a plurality of intermodulation products in the output spectrum of the frequency translation device resulting from the stimulus condition input, the plurality of intermodulation products further comprising a plurality of sum intermodulation products and a plurality of difference intermodulation products;
a predetermined file format to store the plurality of sum intermodulation products and the plurality of difference intermodulation products in a plurality of output files according to the predetermined file format;
a variable assigned to identify the intermodulation products stored in each of the plurality of output files as a sum intermodulation product or a difference intermodulation product;
an index file to identify the stored output files, the stored output files identified by at least one variable of the index file associated with the supplied stimulus condition.

20. The system of claim 19, wherein the frequency translation device is a mixer.

21. The system of claim 19, wherein the stimulus condition input is a sweeping stimulus condition input.

22. The system of claim 19, wherein the stimulus supply further comprises a plurality of signal generators.

23. The system of claim 19, wherein the output measurement device is a spectrum analyzer.

24. The system of claim 19, wherein the intermodulation products measured are amplitude values.

25. The system of claim 19, wherein the intermodulation products measured are complex values representing amplitude and phase components.

26. The system of claim 19, the predetermined file format further comprises a storage format whereby the sum intermodulation products and the difference intermodulation products are stored within the same file.

27. The system of claim 19, wherein the predetermined file format further comprises a storage format whereby the sum intermodulation products and the difference intermodulation products are stored within separate files.

28. The system of claim 19, wherein the assigned variable is stored with the intermodulation product.

29. The system of claim 19, wherein the index file is in accordance with a microwave data interface file format.

30. The system of claim 19, further comprising a simulation device to simulate the response of the frequency translation device to a simulated stimulus condition.

31. The system of claim 30, wherein the simulation device further comprises:
a simulated stimulus condition selector to select a stimulus condition, the selected stimulus condition identifying the index file, the index file identifying and extracting the intermodulation products from the stored output files associated with the simulated stimulus condition; and
a display to display the extracted intermodulation products to provide an expected response of the frequency translation device to the simulated stimulus condition.

32. The system of claim 30, wherein the simulated stimulus condition further comprises a simulated sweeping stimulus condition.

33. The system of claim 31, wherein the simulated response is displayed graphically.

34. The system of claim 33, wherein the simulated response is displayed graphically in three-dimensions.

35. A system for characterizing and simulating a frequency translation device, comprising:
a stimulus supply to supply a stimulus condition input to the frequency translation device to generate an output spectrum;
an output measurement device to measure a plurality of intermodulation products in the output spectrum of the frequency translation device resulting from the stimulus condition input, the plurality of intermodulation products further comprising a plurality of sum intermodulation products and a plurality of difference intermodulation products;
a predetermined file format to store the plurality of sum intermodulation products and the plurality of difference intermodulation products in a plurality of output files according to the predetermined file format;
a variable assigned to identify the intermodulation products stored in each of the plurality of output files as a sum intermodulation product or a difference intermodulation product;
an index file to identify the stored output files, the stored output files identified by at least one variable of the index file associated with the supplied stimulus condition,
a simulated stimulus condition selector to select a stimulus condition, the selected stimulus condition identifying the index file, the index file identifying and extracting the intermodulation products from the stored output files associated with the simulated stimulus condition; and a display to display the simulated response of the frequency translation device by displaying the extracted intermodulation products to provide an expected response of the frequency translation device to the simulated stimulus condition.

* * * * *